US006947346B2

United States Patent
Shore et al.

(10) Patent No.: US 6,947,346 B2
(45) Date of Patent: *Sep. 20, 2005

(54) REDUCING DIGIT EQUILIBRATE CURRENT DURING SELF-REFRESH MODE

(75) Inventors: Michael Shore, Boise, ID (US); Brian P. Callaway, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 10/768,829

(22) Filed: Jan. 30, 2004

(65) Prior Publication Data

US 2004/0184336 A1 Sep. 23, 2004

Related U.S. Application Data

(63) Continuation of application No. 10/232,739, filed on Aug. 29, 2002, now Pat. No. 6,711,093.

(51) Int. Cl.[7] .................................................. G11C 7/00
(52) U.S. Cl. ............. 365/222; 365/189.11; 365/230.06; 365/236
(58) Field of Search ......................... 365/222, 189.11, 365/230.06, 236

(56) References Cited

U.S. PATENT DOCUMENTS

| 5,627,791 | A | | 5/1997 | Wright et al. ................ 365/222 |
| 5,818,777 | A | | 10/1998 | Seyyedy ...................... 365/222 |
| 5,995,434 | A | * | 11/1999 | Ryu ............................. 365/222 |
| 6,137,743 | A | * | 10/2000 | Kim ............................. 365/222 |
| 6,310,802 | B1 | | 10/2001 | Ma et al. ................ 365/189.06 |
| 6,359,823 | B2 | | 3/2002 | Mullarkey ................... 365/222 |
| 6,366,495 | B2 | | 4/2002 | Miwa et al. ............ 365/185.03 |
| 6,392,948 | B1 | | 5/2002 | Lee ............................. 365/222 |
| 6,404,685 | B1 | | 6/2002 | Pinney ........................ 365/203 |
| 6,411,543 | B2 | | 6/2002 | Narui et al. ................. 365/149 |
| 6,711,093 | B1 | * | 3/2004 | Shore et al. ................. 365/236 |

* cited by examiner

*Primary Examiner*—Anh Phung
*Assistant Examiner*—Pho M. Luu
(74) *Attorney, Agent, or Firm*—Fish & Neave IP Group Ropes & Gray LLP; Evelyn C. Mak

(57) ABSTRACT

Digit equilibrate current is reduced during self-refresh mode by reducing the time that the sub-arrays in a volatile memory are precharged with the bleeder device enabled. A selected sub-array is precharged with the bleeder device enabled one cycle prior to having a given row of memory cells refreshed. An auto-refresh counter and row address block are used to generate a section address and a row address of memory cells to refresh. Each sub-array has a given row of memory cells refreshed before another row of memory cells in a given sub-array is refreshed.

32 Claims, 9 Drawing Sheets

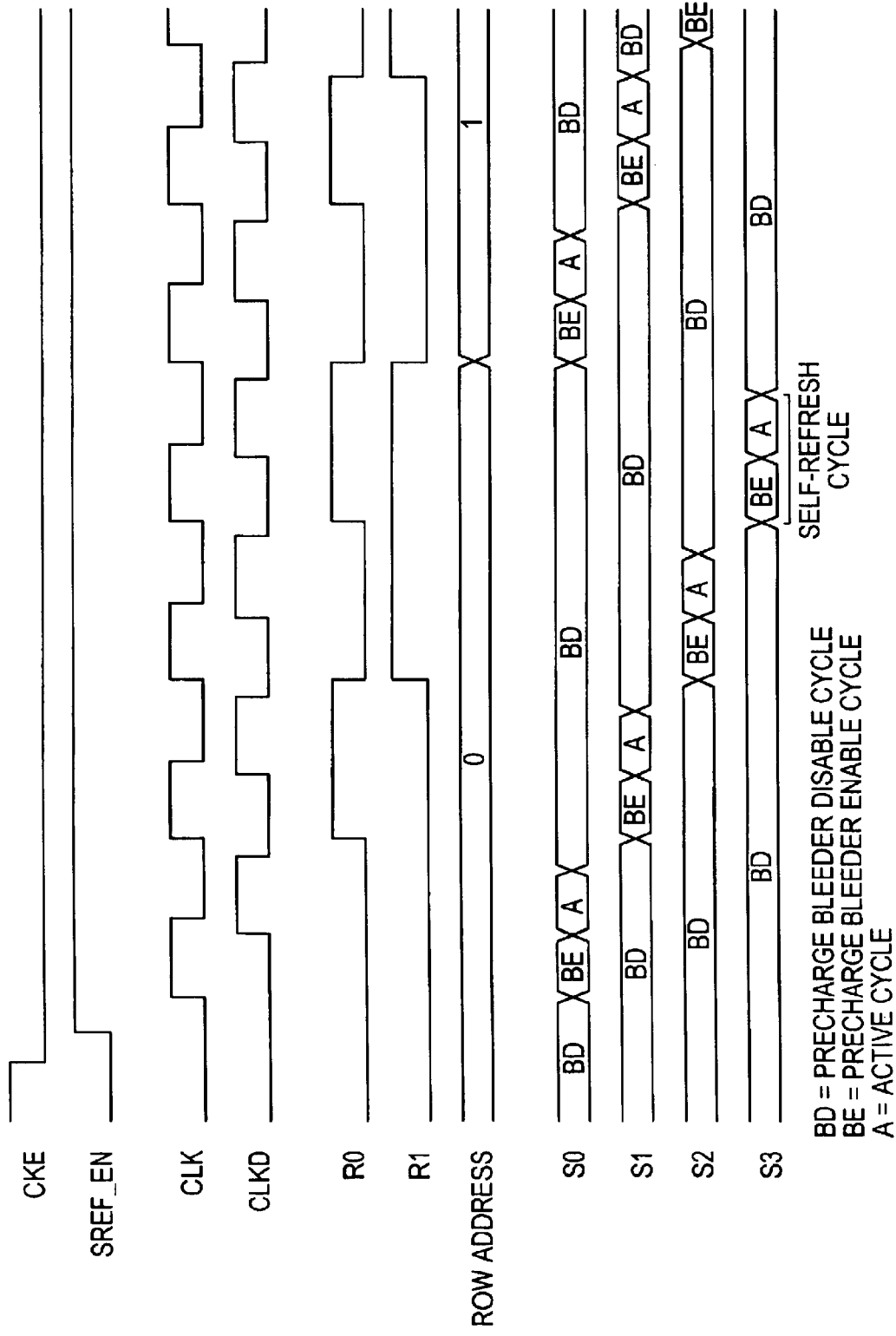

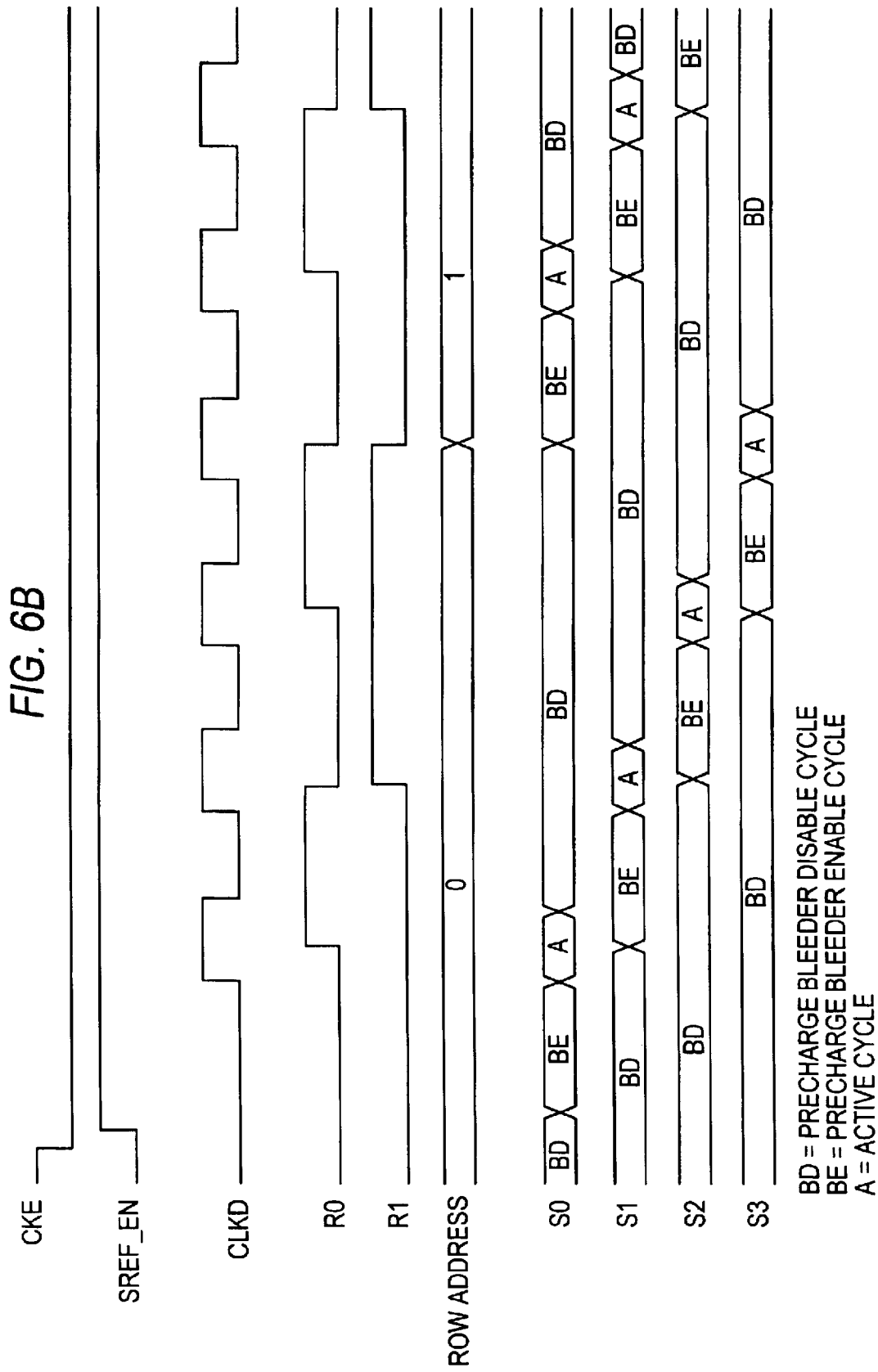

REDUCING DIGIT EQUILIBRATE CURRENT DURING SELF-REFRESH MODE

CROSS REFERENCE TO RELATED APPLICATION

This is a continuation of commonly-assigned U.S. patent application Ser. No. 10/232,739, filed Aug. 29, 2002, now U.S. Pat. No. 6,711,093.

BACKGROUND OF THE INVENTION

This invention relates to memory devices. More particularly, this invention relates to reducing digit equilibrate current during self-refresh mode in memory devices.

A memory device stores data in the form of binary digits. Memory can be arranged in an array containing rows and columns of memory cells, where each cell contains one bit of data (i.e., binary "1" or binary "0"). Memory is typically broadly classified as volatile and nonvolatile.

Nonvolatile memory retains its contents after power is turned off. Nonvolatile memory includes, for example, read only memory (ROM), programmable ROM (PROM), erasable programmable ROM (EPROM), electronically erasable programmable ROM (EEPROM), and flash memory.

Volatile memory, on the other hand, provides temporary data storage. Some types of volatile memory retain their content as long as power is on. Other types of volatile memory retain their content as long as power is on and refreshing techniques are applied. Volatile memory includes most types of random access memory (RAM) (e.g., static RAM (SRAM), dynamic RAM (DRAM), and synchronous DRAM (SDRAM)) and non-random access memory (e.g., first-in first-out (FIFO), last-in first-out (LIFO), shift registers, and contents-addressable memory (CAM)). Volatile memory is ubiquitous in electronic systems such as computers.

In volatile memory such as RAM, a binary digit is stored either in a circuit element such as a flip-flop or as a charge on a capacitor. In particular, SDRAMs store data as charge on a capacitor. The voltage level across the capacitor represents the binary digit. For example, a voltage of about $V_{DD}$ (i.e., source voltage) represents a binary "1" while a voltage of about 0 volts (i.e., ground) represents a binary "0." Over time, the capacitor discharges, causing the voltage across the capacitor to change. In some instances, a defect in the capacitor can also cause the voltage to change. If the memory cell is not refreshed, incorrect data may be represented in the memory cell.

In order to preserve a memory cell's contents, the memory cell must be refreshed periodically. During this refresh period, a sense amplifier detects and amplifies (i.e., restores) the voltage level in the memory cell. For example, when a voltage representing a binary "1" stored in a memory cell loses charge so that the voltage across the capacitor becomes less than $V_{DD}$, the sense amplifier will amplify that voltage back to $V_{DD}$. When a voltage representing a binary "0" stored in a memory cell is increased, for example, because of a defect in the capacitor, the sense amplifier will restore that voltage back to ground.

For SDRAM, there are generally two automated memory refresh methods: an auto-refresh mode and a self-refresh mode. Auto-refresh mode is typically used during normal operation (e.g., when an electronic system is in a mode other than low power or sleep mode). It begins when the system issues an auto-refresh command, which the system does periodically. Each auto-refresh command executes a self-timed, precharge-to-active sequence on one or more rows corresponding to an internally-generated address in memory. In self-refresh mode, auto-refresh commands are internally triggered by an on-chip interval timer. Self-refresh mode is typically used when the system is in low-power or sleep mode, which is initiated by a clock enable signal that typically switches from high to low (i.e., from binary "1" to binary "0") immediately followed by an auto-refresh command.

Memory is typically divided into sub-arrays (i.e., sections) with row lines associated with each row of memory cells in each sub-array and with digit pairs (i.e., complementary digit lines) associated with each column of memory cells in each sub-array. A given sub-array typically spans a contiguous digit line and row line bus. Generally, one sub-array is refreshed at a time. While a given sub-array is idle during self-refresh mode, digit pairs are continuously precharged. When digit pairs are precharged, the lines are forced to a median voltage between the source voltage and ground (e.g., $V_{DD}/2$). A digit equilibrate generator can be used, for example, to generate this median voltage. A conductive path is formed from the digit equilibrate generator to the digit pairs when a bleeder device is enabled.

Much engineering goes into optimizing a bleeder device to supply sufficient current to handle normal leakage mechanisms on the digit pairs while at the same time limiting the bleeder device from supplying too much current when there is a significant defect that shorts a row line to a digit line. These defects cause additional power consumption when the bleeder device is enabled since the row line is grounded and the digits are precharged to the median voltage. This optimization is often accomplished by designing the bleeder device with a higher resistance. However, this typically increases the area of the bleeder device, which is undesirable in light of the trend towards smaller memory devices with increased memory capacity.

In view of the foregoing, it would be desirable to provide a self-refresh mode that pulses a bleeder device to reduce the digit equilibrate current without increasing the area of the bleeder device.

SUMMARY OF THE INVENTION

It is an object of this invention to provide a self-refresh mode that pulses a bleeder device to reduce the digit equilibrate current without increasing the area of the bleeder device.

In accordance with this invention, apparatus and methods for reducing digit equilibrate current during self-refresh mode are provided that reduce the time that digit pairs associated with a column of memory cells in each sub-array are precharged with the bleeder device enabled and that provides a substantially consistent precharge-to-active versus active-to-precharge duty cycle for all internally generated refresh cycles across all sub-arrays. A duty cycle represents a proportion of time that a system is in a particular cycle (e.g., in a precharge cycle, in an active cycle).

In self-refresh mode, each sub-array can refresh a row of memory cells before another row of memory cells in a given sub-array is refreshed. An internal auto-refresh counter and a row address block is used to select the sub-array and a row of memory cells to refresh within that sub-array. Refreshing a row of memory cells in a sub-array has two cycles: a precharge cycle and an active cycle (A). The precharge cycle (P) can further be divided into two sub-cycles: a bleeder enable cycle (BE) and a bleeder disable cycle (BD). In a bleeder enable cycle, a bleeder driver associated with a selected sub-array enables all bleeder gates in the selected sub-array to drive their digit pairs to a precharge voltage generated by a digit equilibrate generator. The digit equilibrate generator generates an intermediate voltage between the source voltage and ground (e.g., VDD/2, where VDD is the source voltage). In another embodiment, each pair of sub-arrays shares a common bleeder driver that is continuously enabled. Isolation transistors are pulsed to allow the digit pairs in the selected sub-array to be precharged. In an active cycle, the selected row line in the selected sub-array is activated (e.g., set to binary "1"), and the corresponding row of memory cells are refreshed.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which:

FIG. 6a is a timing diagram of various signals in self-refresh mode in accordance with one embodiment of the invention;

FIG. 6b is a timing diagram of various signals in self-refresh mode in accordance with another embodiment of the invention;

DETAILED DESCRIPTION OF THE INVENTION

The invention reduces digit equilibrate current during self-refresh mode. Memory, in particular volatile memory such as synchronous dynamic random access memory (SDRAM), is comprised of individual memory cells containing one data bit each. While the invention is described primarily in the context of SDRAM for specificity, the invention applies to other types of volatile memory. To preserve the data bit stored in a memory cell, the memory cell is refreshed periodically. When an electronic system such as a computer enters a low-power or sleep mode, circuitry internal to the memory initiates self-refresh modes periodically to refresh the memory cells until the system exits low-power or sleep mode. Low-power or sleep mode typically occurs, for example, after a predetermined period of user inactivity.

A memory is typically divided into multiple sub-arrays. Each sub-array has row lines extending across each row of memory cells and has pairs of complementary digit lines extending across each column of memory cells. Alternatively, each sub-array can have column lines associated with each column of memory cells and can have digit pairs associated with each row of memory cells. Although memory can be organized in any suitable arrangement, it is described herein for specificity and clarity as sub-arrays with row lines and digit pairs extending across each column of memory cells. Each sub-array can refresh a row of memory cells before another row of memory cells in a given sub-array is refreshed. An auto-refresh counter and row address block are used to generate a sub-array address and a row address of memory cells to refresh.

Once a sub-array has been selected, refreshing the selected row of memory cells occurs over two cycles: a precharge cycle (P) and an active cycle (A). The precharge cycle (P) can further be divided into two sub-cycles: a bleeder enable cycle (BE) and a bleeder disable cycle (BD). In a bleeder enable cycle, a bleeder driver associated with a selected sub-array enables all bleeder gates in the selected sub-array to drive their digit pairs to a precharge voltage generated by a digit equilibrate generator. The digit equilibrate generator generates an intermediate voltage between the source voltage (VDD) and ground (0 V) (e.g., VDD/2). Sub-arrays currently in a bleeder disable cycle have it digit pairs floating because their bleeder gates are disabled. In the active cycle, the selected row line in the selected sub-array is activated (e.g., set to binary "1") and the corresponding row of memory cells is refreshed.

Figure 1:
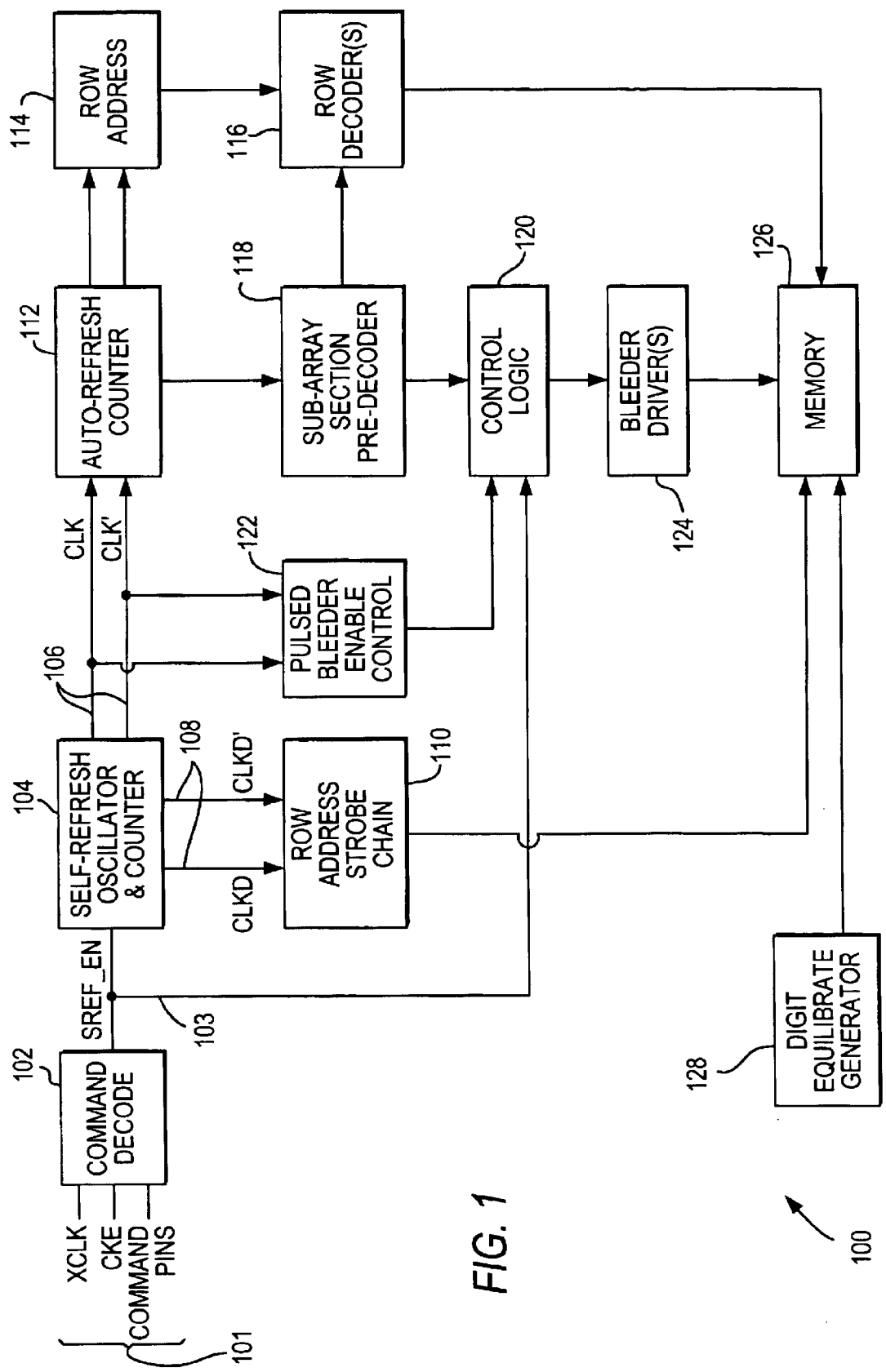
FIG. 1 is a block diagram of a memory device with self-refresh circuitry in accordance with an embodiment of the invention.

FIG. 1 shows memory device 100 with self-refresh circuitry in accordance with an embodiment of the invention. Self-refresh mode begins when an electronic system that incorporates memory device 100, such as a computer system, enters low-power or sleep mode. Low-power or sleep mode is generally indicated by a control signal, known as a clock enable (CKE) signal, that deactivates the system clock by, for example, switching from high (i.e., binary "1") to low (i.e., binary "0") followed by an internally triggered self-refresh command. The CKE signal and self-refresh command may be part of input signals 101 into a command decode block 102. When the CKE signal goes low and an auto-refresh command is issued, command decode block 102 activates (e.g., switches from low to high) a self-refresh enable (SREF_EN) signal 103, initiating the self-refresh mode. The self-refresh mode, which executes asynchronously to the system clock, continues until the system clock is reactivated by the CKE signal (e.g., CKE switches from low to high).

SREF_EN signal 103 is input to a self-refresh oscillator & counter 104 in memory device 100. When SREF_EN signal 103 is activated, self-refresh oscillator & counter 104 generates two pairs of clock signals: CLK/CLK' signals 106 and CLKD/CLKD' signals 108. CLK/CLK' signals 106 are used to regulate the generation of section addresses and row addresses in a memory 126 and to initiate the precharge bleeder enable cycle. CLKD/CLKD' signals 108, which may be delayed clock signals of CLK/CLK' signals 106, are used to implement the active cycle. Clock signals 106 and 108 are internally timed signals independent of the system clock and used during self-refresh mode without any control external to memory device 100.

CLKD/CLKD' signals 108 are sent to a row address strobe (RAS) chain 110. RAS chain 110 monitors each row access in memory block 126, which can include one or more sub-arrays. RAS chain 110 can include circuitry to ensure that the selected sub-array has been fully precharged with the bleeder driver enabled one cycle prior to having its memory cells refreshed. RAS chain 110 also include circuitry to generate input signals to memory 126 in order to implement the active cycle.

CLK/CLK' signals 106 are sent to an auto-refresh counter 112. Auto-refresh counter 112 generates a section address in memory 126. As auto-refresh counter 112 increments with each pulse sent by CLK/CLK' signals 106, a different section address is generated. Each successive section address generated in auto-refresh counter 112 corresponds to a memory organizational entity, such as, for example, a successive sub-array in memory 126. Auto-refresh counter 112 may be implemented using flip-flops, an adder, an accumulator, a combination of combinatorial logic, or any other suitable device or devices that can step through each section address in memory 126.

When each section address has been generated for a given row in memory 126, auto-refresh counter 112 resets to zero (e.g., after each section is accessed, the counter starts over to index each section for another row) and causes a row address block 114 to index another row. Each successive row address generated in row address block 114 corresponds to a memory organizational entity, such as, for example, a successive row in memory 126. Row address block 114 may be implemented using flip-flops, a counter, an adder, an accumulator, a combination of combinatorial logic, or any other suitable device or devices that can step through each row address in memory 126.

The section address generated by auto-refresh counter 112 is sent to a sub-array section pre-decoder 118. Pre-decoder 118 uniquely maps the section address generated in auto-refresh counter 112 to a sub-array in memory 126. Pre-decoder 118 can be implemented using any suitable combination of logic elements.

The outputs of row address block 114 and pre-decoder 118 are sent to a row decoder block 116. Row decoder block 116 can include one or more row decoders, with each sub-array in memory 126 having a corresponding row decoder. Row decoder block 116 uniquely maps the sub-array mapped in pre-decoder 118 and the row address generated in row address block 114 to a row within a sub-array in memory 126. Row decoder block 116 can be implemented using any suitable combination of logic elements.

The output of pre-decoder 118 is also sent to control logic 120. Control logic 120 controls access to memory 126 by, for example, enabling one sub-array in memory 126 to have a decoded row of memory cells refreshed (e.g., a precharge bleeder enable cycle and an active cycle) before enabling a next sub-array in memory 126 to have a decoded row of memory cells refreshed. Control logic 120 can equalize precharge and active timing of a row of memory cells in each sub-array such that consistent precharge-to-active versus active-to-precharge duty cycle time is achieved for all refresh cycles across all sub-arrays. The duty cycle represents a proportion of time that a system is in a particular cycle (e.g., a bleeder enable cycle, an active cycle, a bleeder disable cycle). Control logic 120 can be implemented using any suitable logic element (e.g., AND gate, multiplexer, etc.), a combination of logic elements (e.g., a NAND gate tied to an inverter, etc.) or other suitable device.

SREF_EN signal 103 and the output of a pulsed bleeder enable control 122 are also input to control logic 120. SREF_EN signal 103 controls the operation of control logic 120. For example, when SREF_EN signal 102 is high (i.e., set to binary "1"), control logic 120 allows access to memory 126. Pulsed bleeder enable control 122, controlled by CLK/CLK' signals 106, sends a binary "1" to control logic 120 when memory 126 is to be accessed during a bleeder enable cycle. The output of control logic 120 is coupled to bleeder driver block 124. Bleeder drive block 124 can include one or more bleeder drivers, with each bleeder driver associated with one or more sub-arrays in memory 126. One bleeder driver is activated at a time, which enables the associated sub-array in memory 126 to be precharged to a voltage generated by a digit equilibrate generator (DEG) 128.

Figure 2:
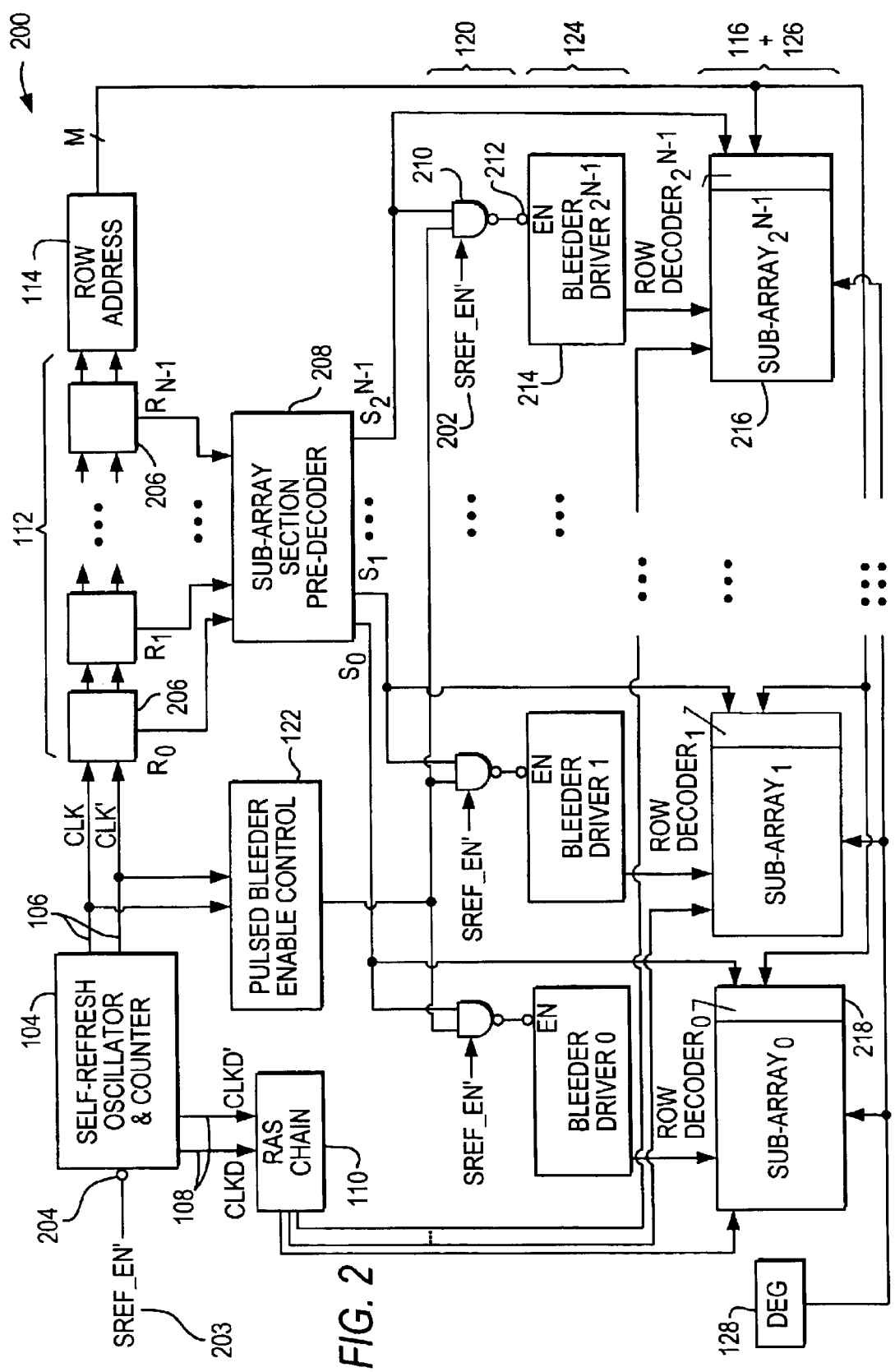
FIG. 2 is a block diagram of a memory device with self-refresh circuitry in accordance with another embodiment of the invention.

FIG. 2 shows a memory device 200 with another embodiment of self-refresh circuitry in accordance with the invention. An activated SREF_EN signal, generated by command decode block 102, initiates self-refresh mode. As shown, the complement of SREF_EN, SREF_EN' signal 203, is sent to an inverter 204 before being input to self-refresh oscillator & counter 104. Command decode block 102 can generate SREF_EN' signal 203 or alternatively, can generate SREF_EN with an inverter coupled to the output to generate SREF_EN' signal 203. Inverter 204 generates the complement of an input signal (e.g., the complement of binary "0" is binary "1" and vice versa). Although SREF_EN signal 103 can be sent to self-refresh oscillator & counter 104 without using the complement and an inverter, the illustrated approach may be simpler to implement by using, for example, transistor logic such as complementary metal-oxide-semiconductor (CMOS) logic.

Self-refresh oscillator & counter 104 internally generates pairs of clock (CLK/CLK') signals 106 and delayed clock (CLKD/CLKD') signals 108. CLK/CLK' signals 106 are sent to auto-refresh counter 112, which can be implemented using a number of flip-flips 206. A flip-flop is a device that can store one bit of data based on an input value and can output a previously stored value at predetermined times based on a clock signal. The number of flip-flops depends on the organization of memory 126 (e.g., the number of sub-arrays 216 that memory 126 is divided into). The number of flip-flops 206 can equal a number of bits needed to uniquely represent each sub-array 216 (e.g., N flip-flops 206 can represent up to $2^N$ sub-arrays). Flip-flops 206 can be toggle (T) flip-flops, D flip-flops, J-K flip-flops, or any other suitable latching device. Each flip-flop 206 can output one data bit (e.g., R0, R1, . . . R(N−1)) representing part of a section address used to select a sub-array 216.

Each output (e.g., $R_0, R_1, \ldots, R_{N-1}$) of flip-flops 206 is sent to a sub-array section pre-decoder 208. Section pre-decoder 208 selects one sub-array 216 at a time by driving a corresponding control line (e.g., $S_1, S_2, \ldots S_2^{N-1}$) to high (i.e., binary "1"). Each sub-array 216 associated with a control line may be arranged sequentially in memory or in any other suitable order.

The output of a last flip-flop 206 in auto-refresh counter 112 is also sent to row address block 114, which can include a number of flip-flops. Row address block 114 increments its contents by one when each flip-flop 206 stores a binary "1" in an immediately previous clock cycle (e.g., $R_0=1, R_1=1$, etc.) in order to access another row in each sub-array 216. While row address block 114 is updated each clock cycle, the value stored in row address block 114 remains the same for a number of clock cycles equal to the number of sub-arrays 216. Row address block 114 has a number of bits (e.g., M) that represents a maximum number of rows in any one sub-array 216. The output bits from row address block 114 are sent to row decoders 218. Each sub-array 216 has a row decoder 218 with a corresponding control line (e.g., $S_0, S_1, \ldots S_2^{N-1}$) as another input. Row decoder 218 maps the input row address to a corresponding row in a selected sub-array 216. Each successive row address may correspond to a sequential row in memory or in any other suitable order.

Table 1 illustrates outputs R0 and R1 of two flip-flops 206 in auto-refresh counter 112 and the contents of row address block 114 for a memory 126 with four sub-arrays 216.

TABLE 1

| CLK Cycle | $R_0$ | $R_1$ | Row Address |
|---|---|---|---|
| 0 | 0 | 0 | 0 |
| 1 | 1 | 0 | 0 |
| 2 | 0 | 1 | 0 |
| 3 | 1 | 1 | 0 |
| 4 | 0 | 0 | 1 |
| 5 | 1 | 0 | 1 |
| 6 | 0 | 1 | 1 |
| 7 | 1 | 1 | 1 |
| 8 | 0 | 0 | 2 |
| 9 | 1 | 0 | 2 |
| 10 | 0 | 1 | 2 |
| 11 | 1 | 1 | 2 |
| . | . | . | . |
| . | . | . | . |
| . | . | . | . |

Each control line (e.g., S0, S1, . . . S2$^{N-1}$) and the output of pulsed bleeder enable control 122 are inputs to a two-input NAND gate 210, which can be controlled by SREF_EN' signal 203. The output of NAND gate 210 is sent to an inverter 212. When SREF_EN' signal 203 is active, the output of NAND gate 210 is binary "0" when both inputs are binary "1" (the output is binary "1" otherwise). When SREF_EN' signal 203 is not active (i.e., when not in self-refresh mode), the output of NAND gate 210 is binary "0." Although an AND gate may be used instead of NAND gate 210 and inverter 212, the illustrated approach may be simpler to implement using transistor logic such as CMOS logic. Note that NAND gate 210 and inverter 212 form part of control logic 120.

When inverter 212 outputs a binary "1," a corresponding bleeder driver 214 is enabled. One bleeder driver is preferably enabled at a time. Control logic 120 can prevent bleeder drivers 214 from enabling while associated sub-arrays are not currently being refreshed. Each sub-array 216 can have a corresponding bleeder driver 214, or a pair of sub-arrays can share a bleeder driver 214, or a group of sub-arrays can share a bleeder driver 214.

Figure 3:
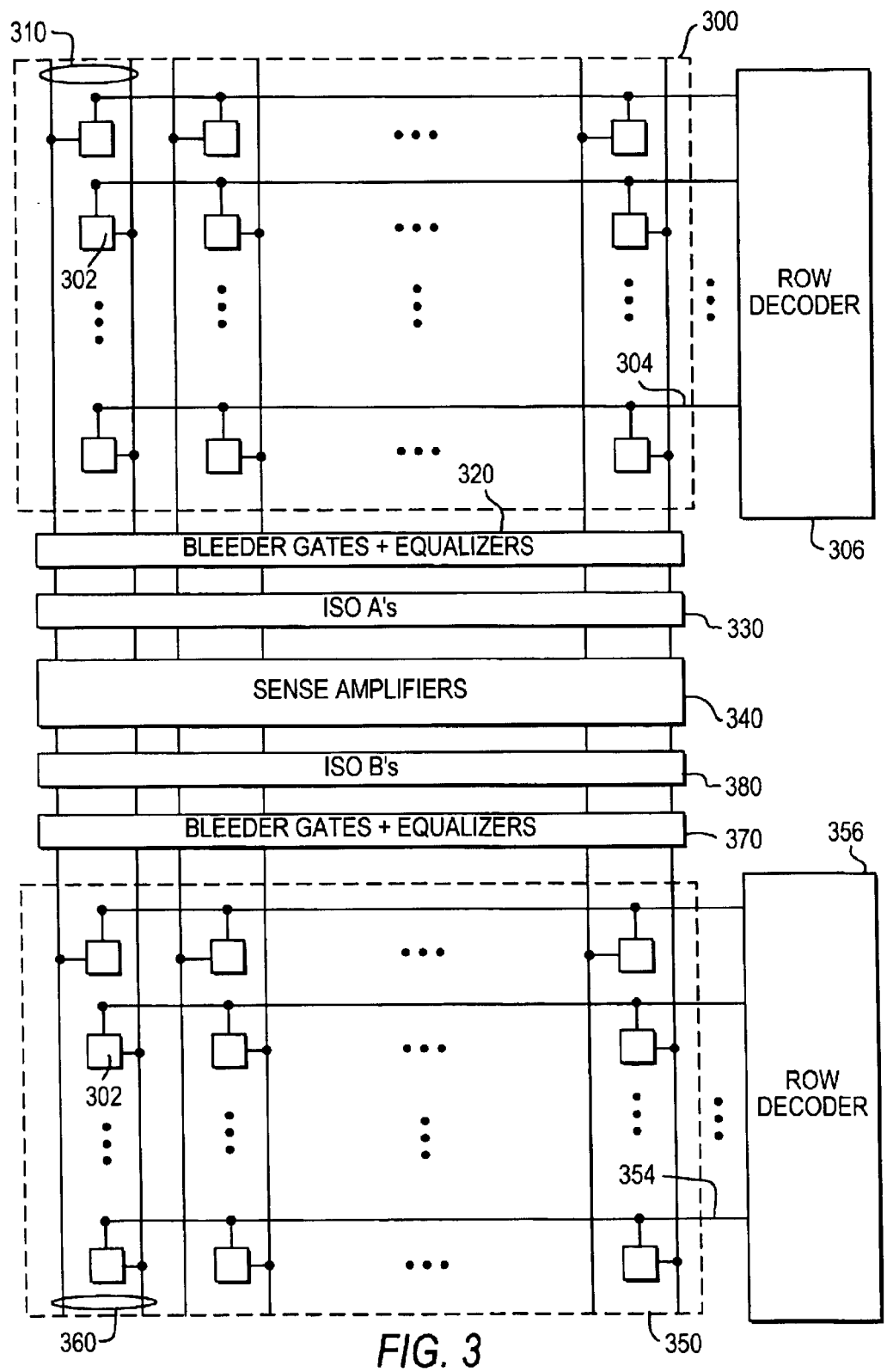
FIG. 3 is a block diagram illustrating two memory sub-arrays in accordance with an embodiment of the invention.

FIG. 3 illustrates two memory sub-arrays with separate bleeder gates in accordance with an embodiment of the invention. Each sub-array 300 and 350 preferably includes an array containing rows and columns of memory cells 302. Memory cells 302 may be SDRAM cells or any other suitable volatile memory cells. Each sub-array 300 and 350 is preferably the same size (i.e., a same number of rows and columns), although different sizes of sub-arrays may be used.

In each sub-array 300 and 350, each row of memory cells is coupled to a row line 304 and 354, respectively. The row lines 304 for sub-array 300 are coupled to an output of a row decoder 306 while the row lines 354 for sub-array 350 are coupled to an output of a row decoder 356. Row decoders 306 and 356 may be part of row decoder block 116.

Each sub-array 300 and 350 preferably has each column of memory cells 302 coupled to respective digit pairs 310 and digit pairs 360. Digit pairs 310 and 360 that extend along a same column of memory cells 302 in sub-arrays 300 and 350 (on either side of sense amplifier block 340) are part of the same digit line bus and have been referenced with different reference numerals for clarity. Digit pairs 310 and 360 are complementary digit lines used by memory 126 to refresh its memory cells.

Each pair of sub-arrays 300 and 350 share a sense amplifier block 340. One sense amplifier in sense amplifier block 340 may be associated with a same column of memory cells with digit pairs 310 and 360 in sub-arrays 300 and 350. During a self-refresh cycle of a memory cell, the digit pair associated with the memory cell is first precharged in the bleeder enable cycle. In the active cycle, the row line associated with the memory cell is set to binary "1," the value stored in the memory cell is read out onto the digit pair, the sense amplifier detects and amplifies the value, and the amplified value is stored back into the memory cell.

Because a same digit pair 310 and 360 is used to access a same column of memory cells in each pair of sub-arrays 300 and 350, isolation transistor blocks (ISO A block 330 and ISO B block 380) are placed on either side of sense amplifier block 340 to allow only one sub-array to have its digit pairs precharged. ISO A block 330 is pulsed by an ISO A signal when sub-array 300 is selected to be refreshed. ISO B block 380 is pulsed by an ISO B signal when sub-array 350 is selected to be refreshed. The ISO A and ISO B signals are preferably pulsed at appropriate times by RAS chain 110.

Bleeder gate and equalizer blocks 320 and 370 are preferably located on the sub-array side of ISO A block 330 and ISO B block 380, respectively. Block 320 allows digit pairs 310 in sub-array 300 to be precharged with the bleeder driver enabled while block 370 allows digit pairs 360 in sub-array 350 to be precharged with the bleeder driver enabled. Each block 320 and 370 has bleeder gates that are preferably driven by a respective bleeder driver 214 and allows its digit pairs 310 and 360 to be precharged to a voltage (e.g., $V_{DD}/2$) generated by a digit equilibrate generator. The bleeder gates may include an n-channel pass gate or any other suitable device that allows digits pairs 310 and 360 to be precharged accordingly. Each block 320 and 370 also has equalizer devices the allows and prevents associated digit pairs 310 and 360 from being precharged. The equalizer devices also prevent digit pairs 310 and 360 from being shorted together when the corresponding bleeder gate is enabled, and further ensure that digit pairs 310 and 360 are precharged to the same voltage. An equalizer enable signal for the equalizer devices is preferably pulsed at appropriate times by RAS chain 110.

Figure 4:
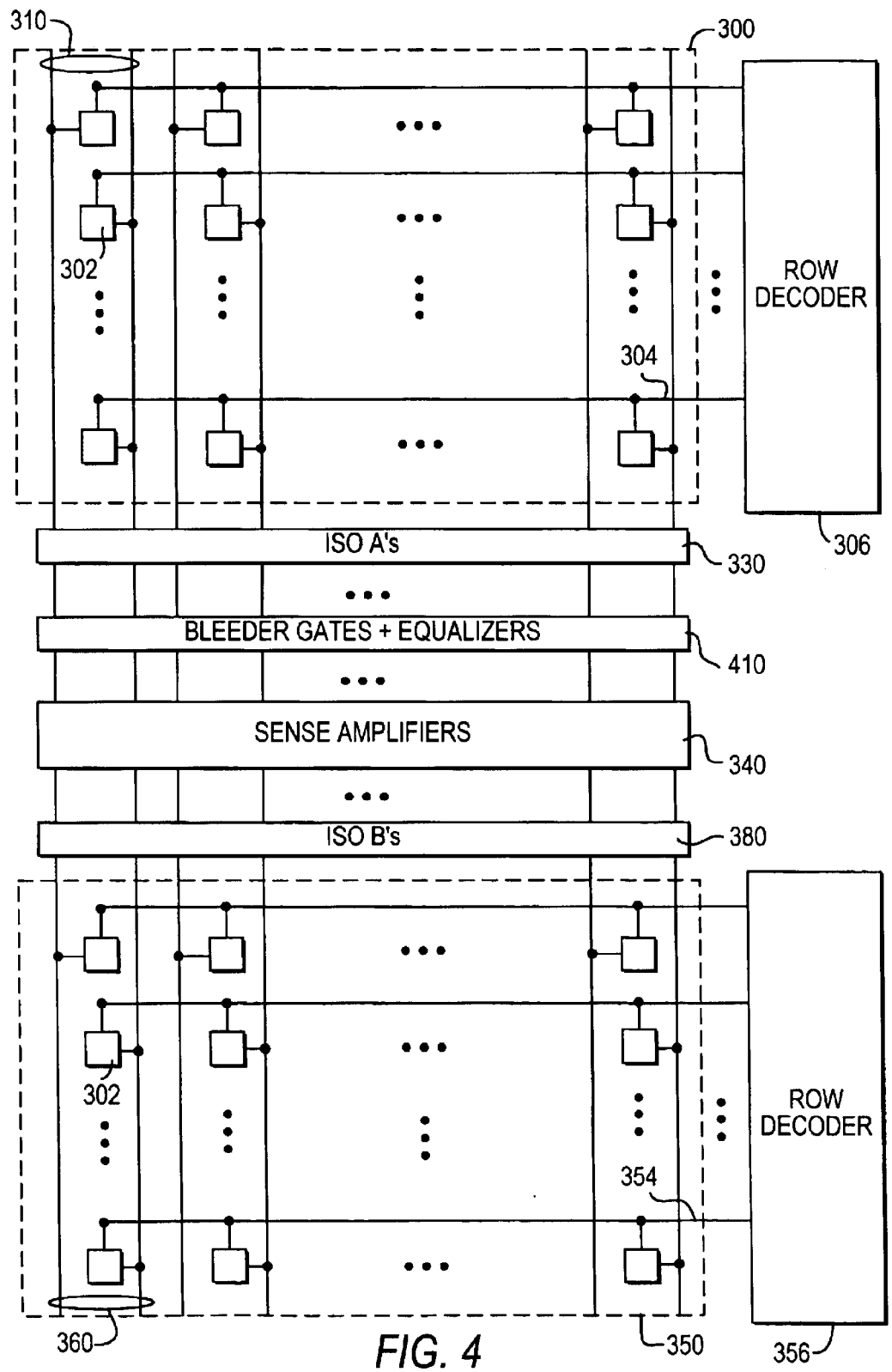
FIG. 4 is a block diagram illustrating two memory sub-arrays in accordance with another embodiment of the invention.

FIG. 4 illustrates two memory sub-arrays sharing common bleeder gates in accordance with another embodiment of the invention. When one sub-array 300 or 350 is selected, a bleeder driver 214 drives bleeder gates in block 410 to enable its digit pairs 310 or 360 to be precharged. Block 410 also has equalizer devices that allow and prevent digit pairs 310 or 360 from being precharged. Sub-array 300 or 350 can be selected by monitoring ISO A block 330 and ISO B block 380, respectively. Any suitable approach may be used to drive block 410. In one embodiment, each pair of sub-arrays 300 and 350 maintains separate bleeder drivers 214. Control logic (e.g., an OR gate or any other suitable logic) is used to drive the bleeder gates in block 410 if either corresponding bleeder driver is enabled. In another embodiment, each pair of sub-arrays 300 and 350 shares a common bleeder driver 214 that is enabled when either corresponding sub-array has been pre-decoded by sub-array section pre-decoder 208. In yet another embodiment, rather than driving bleeder drivers 214 for a sub-array one cycle prior to having a row of memory cells refreshed, bleeder drivers 214 can be continuously enabled and therefore continuously driving bleeder gate block 410. When a sub-array 300 or 350 is selected to be precharged with the bleeder driver enabled, the ISO A block 330 or ISO B block 350 is pulsed with an ISO A signal or ISO B signal, respectively. The selected sub-array is still precharged with the bleeder driver enabled one cycle prior to having a row of memory cells in a selected sub-array refreshed.

Figure 5:
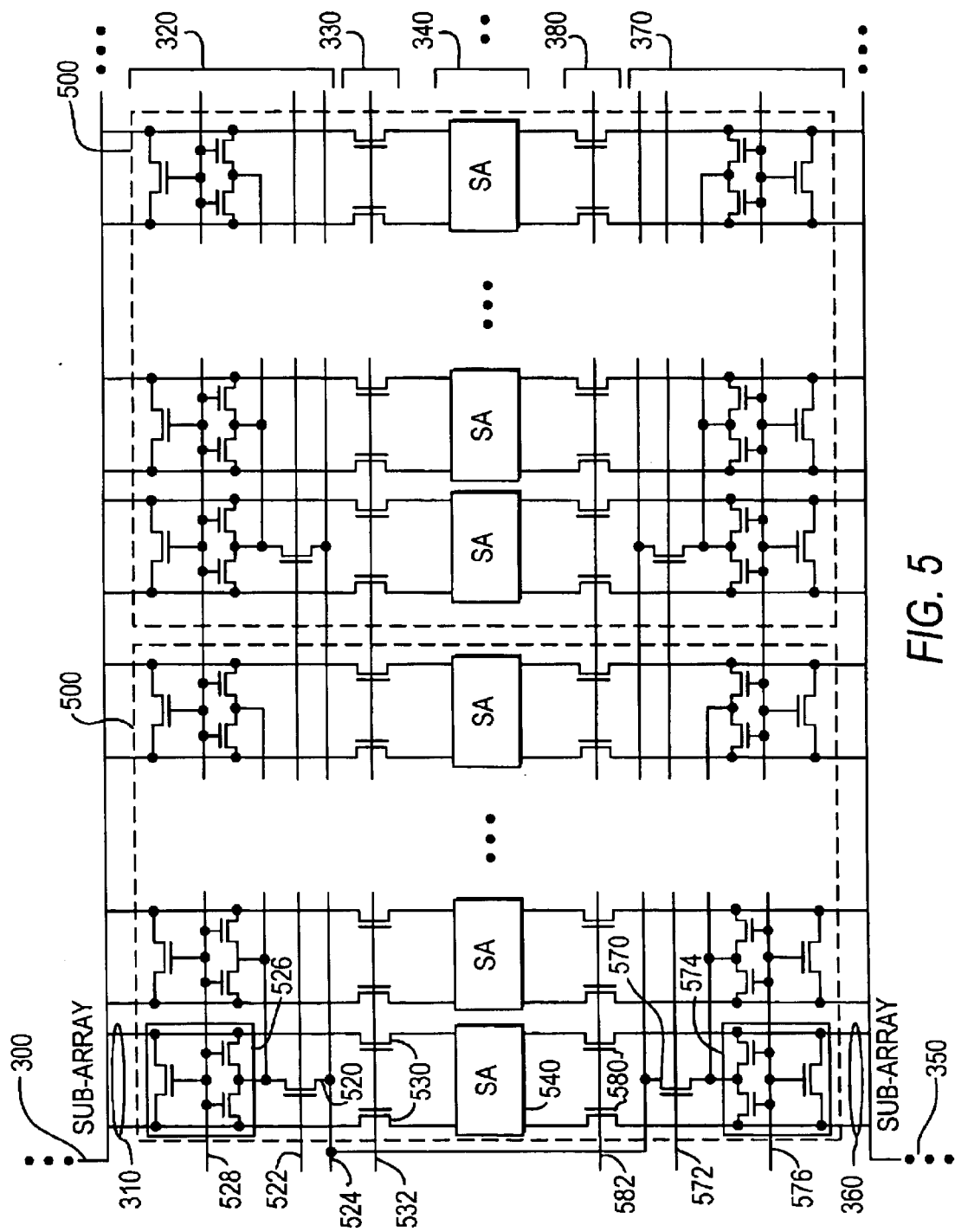
FIG. 5 is a diagram illustrating in more detail a portion of the two memory sub-arrays of FIG. 3 in accordance with the invention.

FIG. 5 illustrates in more detail a portion of two memory sub-arrays with separate bleeder gates in accordance with the invention. Bleeder gate and equalizer blocks 320 and 370, ISO A block 330, ISO B block 380, and sense amplifier block 340 may be grouped into multiple blocks 500. Each block 500 may be associated with one or more columns of memory cells in sub-arrays 300 and 350. Each block 500 may have one bleeder gate 520 associated with multiple columns in sub-array 300 and one bleeder gate 570 associated with multiple columns in sub-array 350. Each bleeder gate 520 and 570 may be an n-channel pass gate, such as an n-channel metal-oxide-semiconductor (NMOS) transistor, or any other suitable device. Bleeder gates 520 may be located between sub-array 300 and ISO A block 330 while bleeder gates 570 may be located between sub-array 350 and ISO B block 380.

An NMOS transistor has a gate node, a source node, and a drain node. Each bleeder gate 520 has a gate node coupled to an output signal 522 from a corresponding bleeder driver 214, a source node coupled to an output signal 524 from a digit equilibrate generator 128, and a drain node coupled to an equalizer 526 for each digit pair 310 in block 500. Equalizer 526 includes gates that are coupled to digit pairs 310 and are monitored by an enable (EQ_ENA) signal 528 that allows digit pairs 310 to be precharged when EQ_ENA signal 528 is active (e.g., binary "1") and bleeder gate 520 is enabled. For example, eight digit pairs 310 has eight equalizers 526 that are coupled to the drain of one bleeder gate 520, although any suitable number of digit pairs may be associated with a single bleeder gate 520, depending on the layout design of the bleeder gate. Each gate 520 and the gates in equalizer 526 behaves like a switch. When signals 522 and 528 are driven high (i.e., binary "1"), a conductive path is formed between the source and drain of gate 520 and digit pairs 310, allowing digit pairs 310 to be precharged to signal voltage 524. When either signal 522 or 528 are driven low (i.e., binary "0"), no conductive path exists, preventing digit pairs 310 from being precharged.

Similar to bleeder gate 520, each bleeder gate 570 can have a gate node coupled to an output signal 572 from a corresponding bleeder driver 214, a source node coupled to output signal 524, and a drain node coupled to an equalizer 574 for each digit pair 360 in block 500. Equalizer 574 includes gates that are coupled to digit pairs 360 and are monitored by an enable (EQ_ENB) signal 576 that allows digit pairs 360 to be precharged when EQ_ENB signal 576 is active and bleeder gate 570 is enabled. When signals 572 and 576 are driven high (i.e., binary "1"), a conductive path is formed between the source and drain of gate 570 and digit pairs 360, allowing digit pairs 360 to be precharged to signal voltage 524. When either signal 572 or 576 are driven low (i.e., binary "0"), no conductive path exists, preventing digit pairs 360 from being precharged.

ISO A block 330 includes a gate 530 for each digit line in digit pairs 310 while ISO B block 380 includes a gate 580 for each digit line in digit pairs 360. Gates 530 and 580 may be n-channel pass gates, such as NMOS transistors, or any other suitable gates. An ISO A signal 532 drives each gate node of gates 530 while an ISO B signal 582 drives each gate node of gates 580. When ISO A signal 532 is driven high, a conductive path is formed between sense amplifiers 540 and sub-array 300 to allow memory cells in sub-array 300 to be refreshed. Similarly, when ISO B signal 582 is driven high, a conductive path is formed between sense amplifiers 540 and sub-array 350 to allow memory cells in sub-array 350 to be refreshed.

EQ_ENA signal 528, EQ_ENB signal 576, ISO A signal 532, ISO B signal 582, and sense amplifier block 540 are monitored and pulsed at the appropriate times by RAS chain 110. These signals are generated by RAS chain 110 in order to refresh a decoded row of memory cells in a decoded sub-array during the active cycle.

FIG. 6a shows the timing of different signals and outputs of a four sub-array memory device 200 during a self-refresh mode. Self-refresh mode begins when a clock enable (CKE) signal switches from high to low (e.g., the system powers down or enters low-power mode) immediately followed by an auto-refresh command, causing a self-refresh enable (SREF_EN) signal to switch from low to high. Memory device 200 remains in self-refresh mode until the CKE signal is reactivated (e.g., the system exits low-power or sleep mode). When the SREF_EN signal is enabled, an internal clock (CLK) signal and its complementary clock (CLK') signal are generated. A delayed clock (CLKD) signal and its complementary clock (CLKD') signal are also generated by self-refresh oscillator and counter 104. The CLK signal regulates the generation of section addresses and row addresses and initiates the precharge bleeder enable cycle (BE) while the CLKD signal initiates the active cycle (A).

Self-refresh mode commands (e.g., to clock a counter, to decode an address or other command, to precharge with the bleeder enable, to refresh, etc.) may be triggered on each rising edge (i.e., in the transition from low to high), each falling edge (i.e., in the transition from high to low), or each rising and falling edge. Alternatively, any other suitable triggering scheme in sync with one of the CLK or CLKD signals may be used. For clarity, FIG. 6a shows signals changing state at each rising edge of the CLK and CLKD signals.

A first flip-flop 206 in auto-refresh counter 112 produces an output R0 that changes state (e.g., from high to low or from low to high) with each rising edge of the CLK signal. The output of the first flip-flop is also input to a second flip-flop 206 that produces an output R1 that changes state with each rising edge of the CLK signal when the value stored in the first flip-flop 206 immediately prior to the rising edge of the CLK signal is a binary "1" (see also Table 1). Although timing diagram 600 shows the high and low transitions as being almost instantaneous, clock skew is generally present. Clock skew is a phenomenon in which a small transition period is required for a signal to change state.

The output of the second flip-flop 206 is fed into row address block 114. Row address block 114 is updated at each rising edge of the CLK signal, but the value stored in row address block 114 is incremented by one when each sub-array has been accessed for a current row. For example, the row address is incremented when the first and the second flip-flop each store a binary "1" in an immediately previous clock cycle.

A self-refresh cycle includes a precharge bleeder enable cycle (BE) and an active cycle (A). A sub-array has its associated digit lines precharged in the bleeder enable cycle immediately prior to having a selected row of memory cells refreshed in the active cycle. Once the self-refresh cycle for a given sub-array is completed, the sub-array stays in a precharge bleeder disable cycle (BD) until the sub-array is accessed again to refresh another row of memory cells. After the sub-array has completed the active cycle, a next sub-array enters the bleeder enable cycle.

The bleeder enable cycle, the active cycle, and the bleeder disable cycle preferably occur at periodic intervals for each sub-array and with respect to the other sub-arrays. The duty cycle for all the bleeder enable cycles is preferably the same for all sub-arrays, the duty cycle for all the active cycles is preferably the same for all sub-arrays, and the duty cycle for all the bleeder disable cycles is preferably the same for all sub-arrays. The duty cycle for the bleeder disable cycles is typically greater than the duty cycles for the bleeder enable cycles and the active cycles. The duty cycle for the bleeder enable cycles is generally different from the duty cycle for the active cycles.

FIG. 6b shows the timing of different signals and outputs of a four sub-array memory device 200 during a self-refresh mode in an alternative embodiment. Rather than synchronizing the bleeder enable cycle with the CLK signal and the active cycle with the CLKD signal, memory device 200 can use self-refresh oscillator and counter 104 to synchronize the bleeder enable cycle with the active cycle. This embodiment reduces the additional circuitry needed to separately synchronize the bleeder enable cycle and the active cycle. Self-refresh oscillator and counter 104 can be implemented using flip-flops to count the number of oscillations generated by a ring oscillator. After a predetermined number of cycles, a clock pulse is generated (e.g., the CLKD signal) and the flip-flops reset to zero to begin counting again. At a certain number of cycles prior to generation of the clock pulse to initiate a next active cycle (e.g., when the values stored in one or more flip-flop equals a predetermined value), a signal can be generated to initiate a bleeder enable cycle for a next sub-array. This signal drives auto-refresh counter 112 and row address block 114 to select a next section and row to refresh. The bleeder enable cycle for a next sub-array can be initiated at any appropriate time after the current sub-array has initiated the active cycle, or after the active cycle has completed, as long as the bleeder enable cycle is initiated for a sufficient time to precharge the next sub-array with the bleeder driver enabled. A logic operation can be performed on the flip-flops in self-refresh oscillator and counter 104 using any logic gate or combination of logic gates (e.g., an AND gate, a NAND gate coupled to an inverter).

Figure 7:
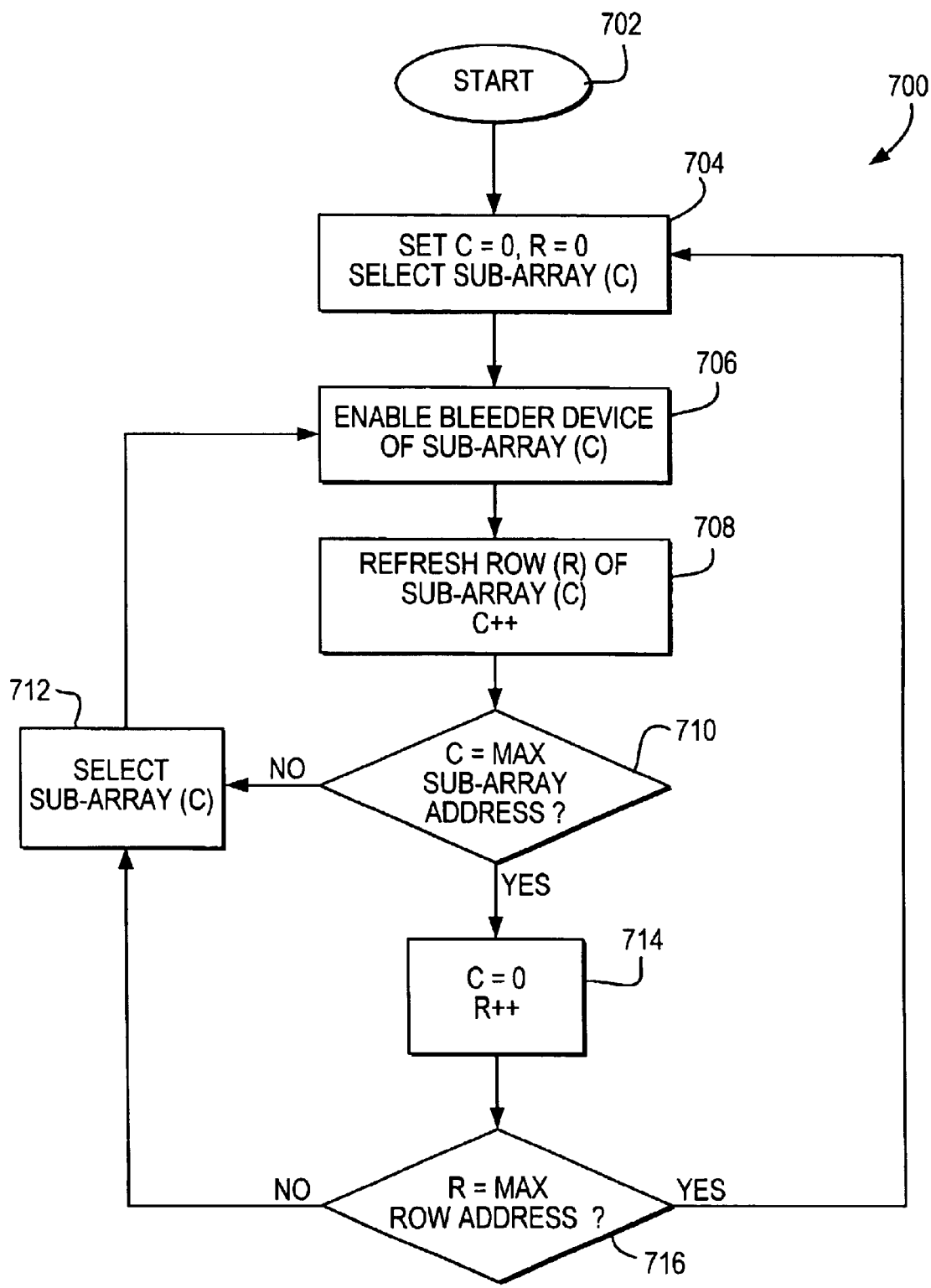
FIG. 7 is a flow diagram of a process for implementing a self-refresh mode in accordance with the invention.

FIG. 7 shows a process 700 for implementing self-refresh mode in accordance with the invention. Process 700 begins at step 702 upon initiation of self-refresh mode. This may be indicated by a CKE signal switching from high to low immediately followed by an auto-refresh command, or by an SREF_EN signal switching from low to high, or by any other appropriate method. At step 704, a counter (C) is set to zero (indicating a first sub-array to be selected) and a row address (R) is set to zero (indicating a first row in a first sub-array). Also at step 704, a first sub-array is selected (e.g., sub-array(0)). Process 700 then moves to step 706 where the first sub-array is processed in the precharge bleeder enable cycle. Next at step 708, memory cells in a first row address (e.g., row(0)) of the first sub-array are refreshed and the counter is incremented by one (indicated by "C++" which is programming notation that means add one to the current value C and store the resulting value back into C). The sub-arrays and rows within the sub-arrays do not need to be accessed sequentially but can be accessed in any order as long as each sub-array is accessed for a given row before any sub-array is accessed again. At step 710, process 700 determines whether the counter equals the maximum sub-array address (i.e., each sub-array has had memory cells in a first row address refreshed). If the maximum sub-array address has not be reached, process 700 moves to step 712 where a next sub-array (e.g., sub-array (1)) is selected and the process returns to step 706. If the maximum sub-array address has been reached, process 700 moves to step 714 where the counter is reset to zero and the row address is incremented by one (indicated by R++). At step 716, process 700 determines whether the row address equals the maximum row address (i.e., each row in all the sub-arrays has been accessed). If the maximum row address has not been reached, process 700 moves to step 712 where the first sub-array (e.g., sub-array(0)) is selected and the process returns to step 706. If the maximum row address has been reached, process 700 returns to step 704.

Memory device 200 exits from process 700 asynchronously once the clock enable (CKE) signal is activated. If CKE signal is activated after a given sub-array has entered the precharge bleeder enable cycle and prior to the completion of the active cycle, the given sub-array is permitted to complete the self-refresh cycle for a selected row.

The invention effectively reduces digit equilibrate current during self-refresh mode by controlling the amount of time that digit pairs in each sub-array are precharged with the bleeder device enabled. A sub-array that will have a row of memory cells refreshed will precharge its digit pairs with the bleeder device enabled one cycle prior to refreshing the row of memory cells. This approach can be implemented in a number of ways, including, for example, (1) enabling a bleeder driver to equilibrate digit pairs corresponding to the selected sub-array when each sub-array has dedicated bleeder gates, and (2) pulsing ISO gates when each sub-array shares a bleeder driver with another sub-array. One sub-array is precharged with the bleeder driver enabled at a time. This approach is particularly efficient when a short occurs between a crossing digit and row line, because it limits the time that current is drawn when the shorted digit line is equilibrated.

The approaches for implementing a pulsed digit equilibrate current can be implemented in sync with internally controlled refresh commands where possible. However, when an electronic system has control over a memory, the invention also provides for the pulsed digit equilibrate current to be disabled. For example, the timing of the precharge and active cycle cannot be controlled for operating conditions such as long raslo, where a given sub-array is active, or static refresh, where all the sub-arrays are inactive. As a result, the bleeder device is continuously enabled or is asynchronously pulsed. Another advantage of the invention is that pulsing a bleeder device involves little or no additional circuitry. The invention makes use of existing circuitry that generates the clock signals, for example, to sync the precharge commands with the refresh commands.

Figure 8:
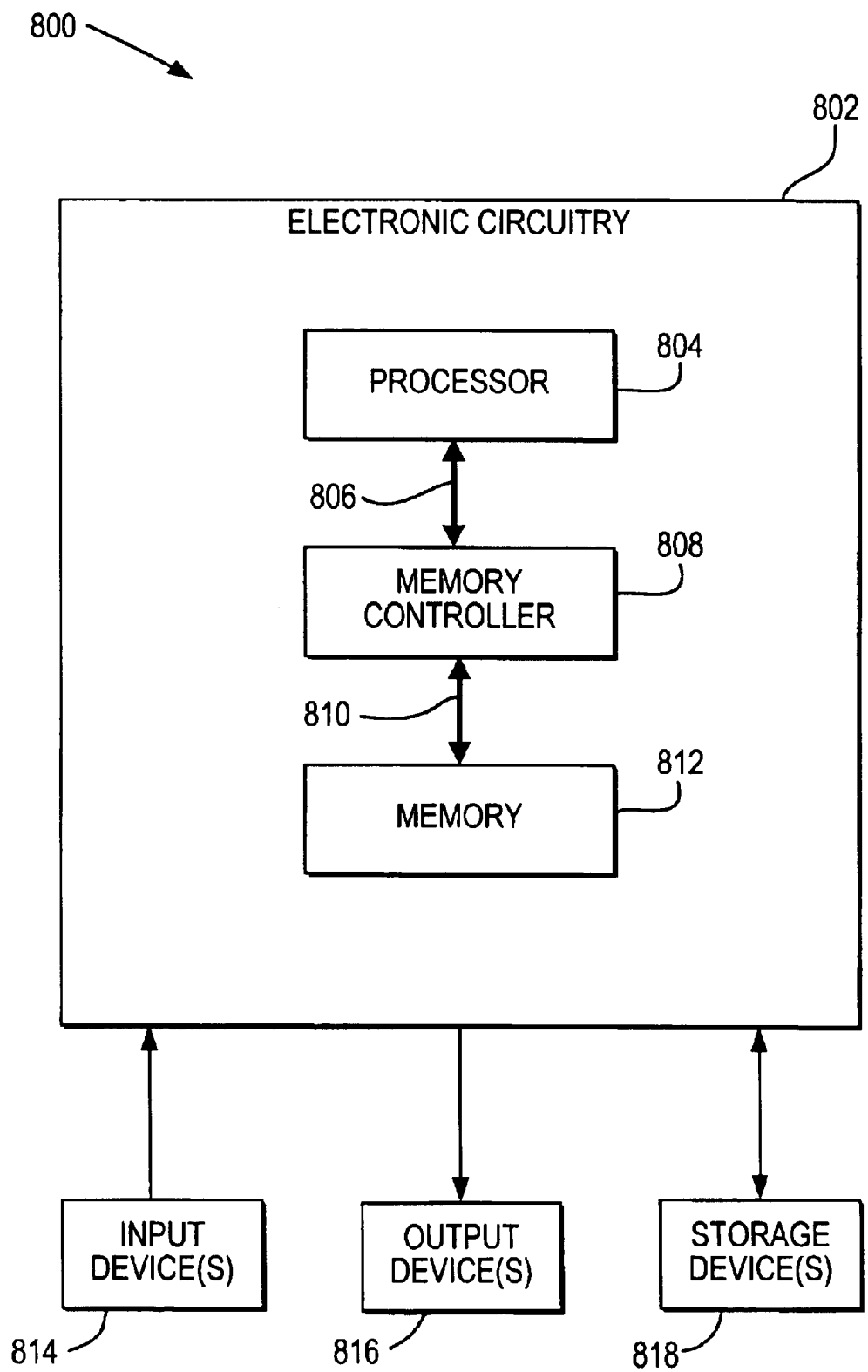
FIG. 8 is a block diagram of a system incorporating the invention.

FIG. 8 shows an electronic system 800 that incorporates the invention. System 800, which can be a computer system, includes electronic circuitry 802 for performing functions such as executing software to perform calculations and various other tasks. Electronic circuitry 802 includes a processor 804, a memory controller 808, and a memory 812. Processor 804 can perform a plurality of operations based on data stored in memory 812. Memory controller 808 performs several functions, including generating memory addresses to read data from and to write data to memory 812. Memory controller 808 may also generate system control signals directing the operation of electronic circuitry 802. These control signals may include directing electronic circuitry 802 to enter or exit low-power or sleep mode. Memory 812 stores data and includes circuitry for implementing a self-refresh mode. Data can be transferred between processor 804 and memory controller 808 via a data bus 806. Similarly, data can be transferred between memory controller 808 and memory 812 via a data bus 810. Data buses 806 and 810 can be any suitable path that allows the transfer of data. Data buses 806 and 810 may be bi-directional or uni-directional. Data can be transferred along data buses 806 and 810 serially, in parallel, or in combinations of both.

Coupled to electronic circuitry 802 is at least one input device 814, at least one output device 816, and at least one storage device 818. Input device 814 can include a keypad, a mouse, a touch-pad display screen, or any other suitable device that allows a user to enter information. Output device 816 can include a video display unit, a printer, or any other suitable device capable of displaying output data generated by processor 804. Alternatively, input device 814 and output device 816 can be a single input/output device. Storage device 818 can include drives that accept hard or floppy disks, tape cassettes, compact discs, or any other external storage media.

Memory 812 (which includes one of memory devices 100 and 200) may be implemented on one or more integrated circuit chips. In one embodiment, the self-refresh circuitry in accordance with the invention may be located on one of the memory chips as a permanent feature. In another embodiment, the self-refresh circuitry may be part of a fuse that can be attachable, to and removable from the memory.

Thus it is seen that digit equilibrate current is reduced during a self-refresh mode. One skilled in the art will appreciate that the invention can be practiced by other than the described embodiments, which are presented for purposes of illustration and not of limitation, and the invention is limited only by the claims which follow.

We claim:

1. A memory device comprising:
   an array of memory cells; and
   self-refresh circuitry operative to equalize precharge and active refresh timing of said array.

2. The memory device of claim 1 wherein said self-refresh circuitry comprises:
   a counter operative to generate an address of said array;
   a driver coupled to said array and operative to precharge said array when enabled and when said address is generated;
   control logic coupled to said driver and operative to enable said driver; and
   a voltage generator coupled to said array and operative to generate a voltage between a source voltage and ground to which said array is precharged.

3. The memory device of claim 2 wherein:
   said array comprises at least one row and one column of memory cells;
   each row of memory cells is coupled to a row line;
   each column of memory cells is coupled to a digit pair, wherein said digit pair comprises a complementary pair of digit lines.

4. The memory device of claim 3 wherein said array further comprises:
   for each digit pair:
     a sense amplifier coupled to said digit pair that refreshes a memory cell coupled to said digit pair whose row line is active, and
     an equalizer coupled to said digit pair that, when enabled, forms a conductive path across said digit pair; and
   for each of a predetermined number of digit pairs, a transistor with:
     a gate node coupled to said driver,
     a source node coupled to said generator, and
     a drain node coupled to each equalizer associated with said predetermined number of digit pairs.

5. The memory device of claim 4 wherein said transistor drives said predetermined number of digit pairs to said voltage when said driver and said equalizer is enabled.

6. The memory device of claim 2 wherein said counter is operative to generate a row address for a row of memory cells in said array.

7. The memory device of claim 6 further comprising a row decoder that maps said row address to said row of memory cells in said array.

8. The memory device of claim 2 wherein said control logic is coupled to said counter and is coupled to receive a first enable signal and a pulsed enable control signal, wherein:
   said first enable signal indicates when said memory device is in self-refresh mode; and
   said pulsed enable control signal indicates when said array is to be precharged.

9. The memory device of claim 8 wherein said control logic is operative to enable said driver when said counter generates said address of said array, said first enable signal is active, and said pulsed enable control signal is active.

10. The memory device of claim 2 wherein for said control logic:
    said precharge timing is a first time period during which said array is driven with said voltage; and
    said active refresh timing is a second time period during which refresh of a row of memory cells in said array occurs.

11. The memory device of claim 2 further comprising:
    a command decoder that initiates self-refresh mode by generating a first enable signal;
    an oscillator & counter coupled to receive said first enable signal and that generates at least one clock signal to update said counter and to enable output of a pulsed enable control signal; and
    circuitry that provides refresh commands in sync with said clock signal.

12. The memory device of claim 2 wherein said counter, said driver, and said control logic are located with said array on an integrated circuit chip.

13. The memory device of claim 2 wherein said counter, said driver, and said control logic are part of a fuse attachable to and removable from an integrated circuit chip containing said array.

14. A method of refreshing memory cells arranged in arrays in a memory device, said method comprising:
    continuously enabling a driver associated with at least one sub-array;
    selecting said sub-array and a row of memory cells within said sub-array;
    pulsing a pair of isolation transistors (ISOs) associated with said sub-array and precharging said sub-array in a first clock cycle; and
    refreshing said row of memory cells within said sub-array in a next clock cycle.

15. The method of claim 14 wherein said continuously enabling, said selecting, said pulsing and precharging, and said refreshing occur in a self-refresh mode of said memory device.

16. The method of claim 14 wherein said pulsing and precharging comprises driving at least one pair of digit lines coupled to a column of memory cells in said sub-array to an intermediate voltage between a source voltage and a ground voltage.

17. The method of claim 14 wherein said refreshing comprises:
   activating a row address line corresponding to said row;
   reading data from said row of memory cells;
   amplifying said read data; and
   writing said amplified data back into said row of memory cells.

18. The method of claim 16 wherein said amplifying comprises:
   driving a data signal to a source voltage when said read data is binary "1"; and
   driving said data signal to a ground voltage when said read data is binary "0".

19. The method of claim 16 wherein said amplifying comprises:
   driving a data signal to a first voltage when said read data is binary "1"; and
   driving said data signal to a second voltage when said read data is binary "0".

20. The method of claim 14 further comprising:
   selecting a second row of memory cells within said sub-array;
   pulsing said pair of ISOs and precharging said sub-array in a third cycle that immediately follows said next cycle; and
   refreshing said second row of memory cells within said sub-array in a fourth cycle.

21. The method of claim 14 further comprising:
   selecting a second row of memory cells within said sub-array;
   pulsing said pair of ISOs and precharging said memory cells after said next cycle is initiated; and
   refreshing said second row of memory cells within said sub-array in a third cycle that immediately follows said next cycle.

22. The method of claim 14 further comprising:
   selecting a second sub-array and said row of memory cells within said second sub-array;
   pulsing a second pair of ISOs associated with said second sub-array and precharging said second sub-array in a third cycle that immediately follows said next cycle; and
   refreshing said row of memory cells within said second sub-array in a fourth clock cycle.

23. The method of claim 14 further comprising:
   selecting a second sub-array and said row of memory cells within said second sub-array;
   pulsing a second pair of ISOs associated with said second sub-array and precharging said second sub-array after said next cycle is initiated; and
   refreshing said row of memory cells within said second sub-array in a third cycle that immediately follows said next cycle.

24. A method of refreshing memory cells arranged in arrays in a memory device, said method comprising:
   selecting a sub-array and a row of memory cells within said sub-array;
   enabling a driver associated with said sub-array and a second sub-array, pulsing a pair of isolation transistors (ISOs) associated with said sub-array, and precharging said sub-array in a first clock cycle; and
   refreshing said row of memory cells within said sub-array in a next clock cycle.

25. The method of claim 24 wherein said selecting, said enabling, pulsing, and precharging, and said refreshing occur in a self-refresh mode of said memory device.

26. The method of claim 24 wherein said enabling, pulsing, and precharging comprises driving at least one pair of digit lines coupled to a column of memory cells in said sub-array to an intermediate voltage between a source voltage and a ground voltage.

27. The method of claim 24 further comprising:
   selecting a second row of memory cells within said sub-array;
   enabling said driver, pulsing said pair of ISOs, and precharging said sub-array in a third cycle that immediately follows said next cycle; and
   refreshing said second row of memory cells within said sub-array in a fourth cycle.

28. The method of claim 24 further comprising:
   selecting a second row of memory cells within said sub-array;
   enabling said driver, pulsing said pair of ISOs, and precharging said memory cells after said next cycle is initiated; and
   refreshing said second row of memory cells within said sub-array in a third cycle that immediately follows said next cycle.

29. The method of claim 24 further comprising:
   selecting said second sub-array and said row of memory cells within said second sub-array;
   enabling said driver, pulsing a second pair of ISOs associated with said second sub-array and precharging said second sub-array in a third cycle that immediately follows said next cycle; and
   refreshing said row of memory cells within said second sub-array in a fourth clock cycle.

30. The method of claim 24 further comprising:
   selecting said second sub-array and said row of memory cells within said second sub-array;
   enabling said driver, pulsing a second pair of ISOs associated with said second sub-array, and precharging said second sub-array after said next cycle is initiated; and
   refreshing said row of memory cells within said second sub-array in a third cycle that immediately follows said next cycle.

31. Apparatus for refreshing memory cells arranged in arrays in a memory device, said method comprising:
   means for continuously enabling a driver associated with at least one sub-array;
   means for selecting said sub-array and a row of memory cells within said sub-array;
   means for pulsing a pair of isolation transistors (ISOs) associated with said sub-array and precharging said sub-array in a first clock cycle; and
   means for refreshing said row of memory cells within said sub-array in a next clock cycle.

32. Apparatus for refreshing memory cells arranged in arrays in a memory device, said method comprising:
   means for selecting a sub-array and a row of memory cells within said sub-array;
   means for enabling a driver associated with said sub-array and a second sub-array, pulsing a pair of isolation transistors (ISOs) associated with said sub-array, and precharging said sub-array in a first clock cycle; and
   means for refreshing said row of memory cells within said sub-array in a next clock cycle.

* * * * *

UNITED STATES PATENT AND TRADEMARK OFFICE
CERTIFICATE OF CORRECTION

PATENT NO. : 6,947,346 B2  Page 1 of 1
APPLICATION NO. : 10/768829
DATED : September 20, 2005
INVENTOR(S) : Michael Shore and Brian P. Callaway It is certified that error appears in the above-identified patent and that said Letters Patent is hereby corrected as shown below:

Column 4, line 24, change "have it digit" to -- have its digit --.

Column 8, line 35, change "the allows and prevents" to -- that allow and prevent --.

Column 11, line 64, change "has not be reached" to -- has not been reached --.

Column 13, line 33, change "attachable, to" to -- attachable to --.

Signed and Sealed this

Eighteenth Day of March, 2008

JON W. DUDAS
*Director of the United States Patent and Trademark Office*